United States Patent
Pan et al.

(10) Patent No.: US 8,866,552 B2
(45) Date of Patent: Oct. 21, 2014

(54) CURRENT-MODE LINE DRIVER

(71) Applicant: Broadcom Corporation, Irvine, CA (US)

(72) Inventors: Hui Pan, Coto De Caza, CA (US); Yuan Yao, Irvine, CA (US); Mostafa Hammad, Irvine, CA (US); Karim Vincent Abdelhalim, Newport Beach, CA (US); Junhua Tan, Tustin, CA (US); Ichiro Fujimori, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/721,786

(22) Filed: Dec. 20, 2012

(65) Prior Publication Data
US 2014/0167851 A1    Jun. 19, 2014

Related U.S. Application Data

(60) Provisional application No. 61/736,772, filed on Dec. 13, 2012.

(51) Int. Cl.
*H03F 3/45*    (2006.01)
*H03F 3/68*    (2006.01)

(52) U.S. Cl.
CPC .............. *H03F 3/45179* (2013.01); *H03F 3/68* (2013.01)
USPC ........................................................ 330/258

(58) Field of Classification Search
USPC .................................................. 330/252–261
See application file for complete search history.

(56) References Cited

U.S. PATENT DOCUMENTS 7,071,780 B2 *   7/2006   Van Zanten .................... 330/258

* cited by examiner

*Primary Examiner* — Hieu Nguyen
(74) *Attorney, Agent, or Firm* — Oblon, Spivak, McClelland, Maier & Neustadt, L.L.P.

(57) ABSTRACT

Disclosed are various embodiments of a current-mode line driver that may facilitate transmitting signals to a load. The current-mode line driver may comprise a common-mode current sense element that provides a signal corresponding to the common-mode output current of the line driver. A transconductance element receives the signal from the common-mode current sense element and provides a compensating current that is based at least in part on the signal. The compensating current may reduce the common-mode output current of the line driver.

18 Claims, 8 Drawing Sheets

US 8,866,552 B2

CURRENT-MODE LINE DRIVER

CROSS-REFERENCE TO RELATED CASES

This application is a continuation of, and claims priority to, U.S. Provisional Patent Application 61/736,772, titled "CURRENT-MODE LINE DRIVER" and filed on Dec. 13, 2012, which is incorporated by reference herein in its entirety.

BACKGROUND

A communication device may communicate with one or more other devices through a conductive line. The communication device may employ a line driver in order to generate amplified signals that are able to travel across various distances and that overcome noise present in the conductive line.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the disclosure. Moreover, in the drawings, like reference numerals designate corresponding parts throughout the several views.

DETAILED DESCRIPTION

Figure 1:
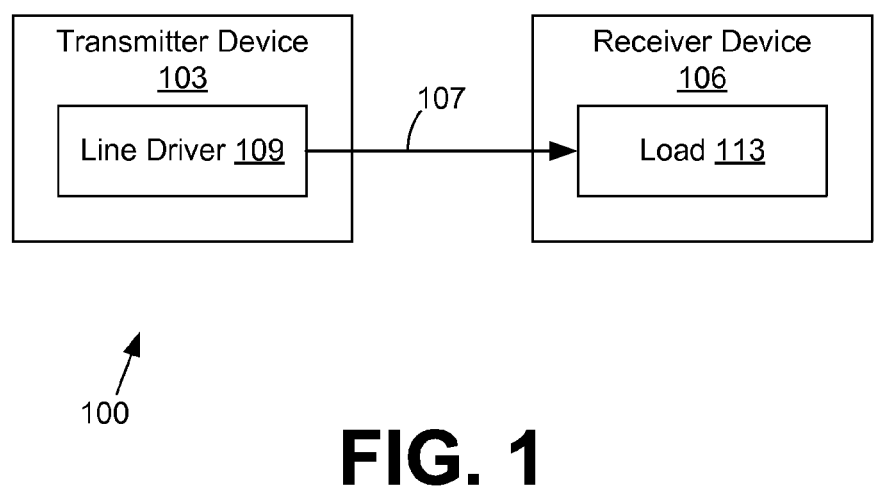
FIG. 1 is a drawing of an example of a communication environment according to various embodiments of the present disclosure.

The present disclosure is directed towards current-mode line drivers that may facilitate communication between communication devices. Reference is made to FIG. 1, which shows an example of a communication environment 100 according to various embodiments of the present disclosure. The communication environment 100 in the present example includes a transmitter device 103 in communication with a receiving device 106 via a conductive medium 107. The conductive medium 107 may be, for example, one or more wires, cables, or any other type of medium that is capable of conducting electrical signals between the transmitter device 103 and the receiver device 106.

The transmitter device 103 is a communication device that is capable of transmitting signals to another device via the conductive medium 107, and the receiver device 106 is a communication device that is capable receiving signals from another device via the conductive medium 107. For the purposes of simplicity, the transmitter device 103 and the receiver device 106 in the present example are in communication using a simplex communication configuration. However, it is understood that according to various embodiments, the transmitter device 103 and the receiver device 106 may communicate using half-duplex communication, full-duplex communication, or any other type of communication configuration. To this end, the transmitter device 103 in various embodiments may include circuitry (not shown) that facilitates receiving data via the conductive medium 107, and the receiver device 106 in various embodiments may include circuitry (not shown) that facilitates transmitting data via the conductive medium 107.

The transmitter device 103 includes a line driver 109 and other components that are not discussed in detail herein for the purposes of brevity. The line driver 109 may receive input data signals in the transmitter device 103 and amplify the signals for transmission to the receiver device 106. By amplifying the signals being transmitted via the conductive medium 107, it may be more likely that the data will reach the receiver device 106 and be of a quality that is usable by the receiver device 106. According to various embodiments, the line driver 109 may be embodied in the form of a current-mode line driver 109 or a voltage-mode line driver 109.

The receiver device 106 includes a load 113 and potentially other components that not discussed in detail herein for brevity. The load 113 represents circuitry that receives the signals transmitted via the conductive medium 107.

Figure 2A:
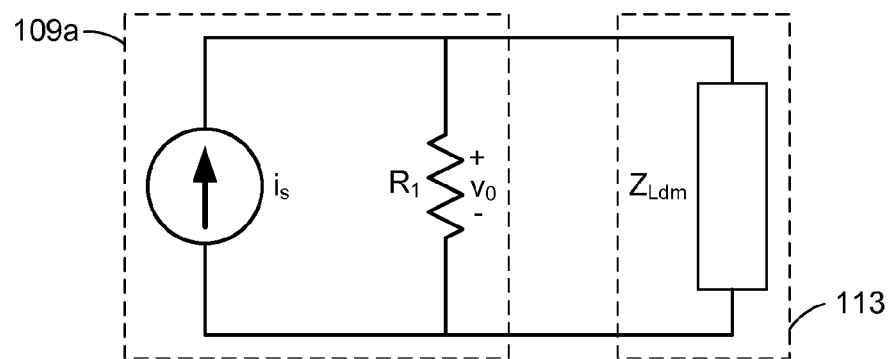
FIG. 2A is a schematic diagram representing an example of a differential-mode equivalent circuit for a current-mode line driver that may be employed in the communication environment of FIG. 1 according to various embodiments of the present disclosure.

Referring to FIG. 2A, shown is an example of a schematic representing an example of a differential-mode equivalent circuit for a current-mode line driver 109, referred to herein as the current-mode line driver 109a, that may be employed in the communication environment 100 (FIG. 1) according to various embodiments of the present disclosure. As shown, the schematic includes representations of the current-mode line driver 109a and the load 113. The current-mode line driver 109a is represented by termination resistance $R_1$ that is across the outputs of the current-mode line driver 109a. Additionally, a source current $i_s$ is associated with the current-mode line driver 109a. Associated with the load 113 is a differential-mode load impedance $Z_{Ldm}$. A differential output voltage $v_O$ is seen across the termination resistance $R_1$ and the differential-mode load impedance $Z_{Ldm}$.

Figure 2B:
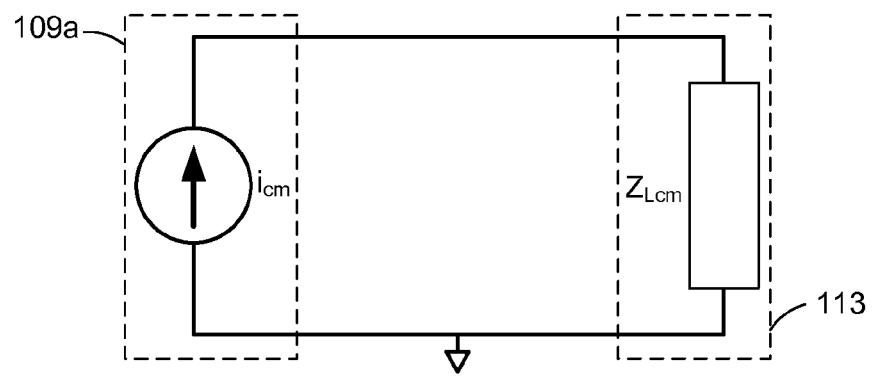
FIG. 2B is a schematic diagram representing an example of a common-mode equivalent circuit for the current-mode line driver of FIG. 2A according to various embodiments of the present disclosure.

Reference is now made to FIG. 2B, which shows a schematic diagram representing an example of a common-mode equivalent circuit for the current-mode line driver 109a of FIG. 2A according to various embodiments of the present disclosure. The common-mode equivalent circuit 203 includes a common-mode current $i_{cm}$, which represents the common-mode current component that may be associated with the current-mode line driver 109a. The common-mode current $i_{cm}$ may be associated with noise, reflections, electromagnetic compatibility/electromagnetic interference (EMC/EMI) issues in the transmitter device 103 (FIG. 1), and/or other effects and may result in undesirable performance by the receiver device 106 (FIG. 1). Associated with the load 113 is a common-mode load impedance $Z_{Lcm}$. In the common mode equivalent circuit 203 shown in FIG. 2B, all of the undesirable common-mode current $i_{cm}$ flows through the common-mode load impedance $Z_{Lcm}$.

Figure 3A:
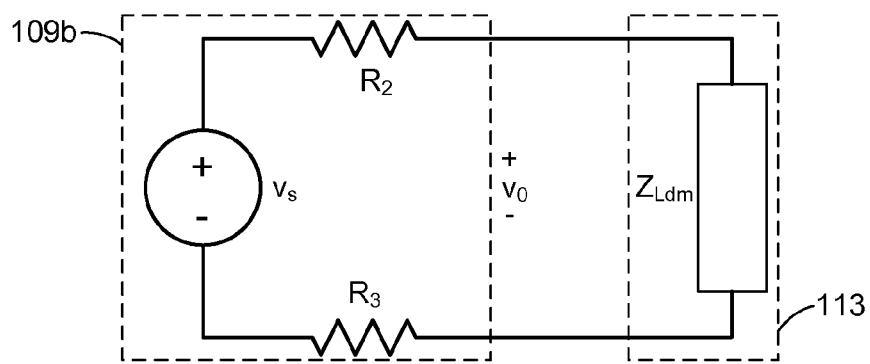
FIG. 3A is a schematic diagram representing an example of a differential-mode equivalent circuit for a voltage-mode line driver that may be employed in the communication environment of FIG. 1 according to various embodiments of the present disclosure.

Reference is now made to FIG. 3A, which shows a schematic diagram representing a differential-mode equivalent circuit for a voltage-mode line driver 109, referred to herein as the voltage-mode line driver 109b, that may be employed in the communication environment 100 (FIG. 1) according to various embodiments of the present disclosure. In the present example, the voltage-mode line driver 109b is represented by a source voltage $v_s$ that is in series with a pair of termination resistances $R_2$-$R_3$. The resistance value for each termination resistance $R_2$-$R_3$ may be represented in relation to termination resistance $R_1$ of FIG. 2A by the following equations:

$$R_2 = \frac{R_1}{2} \quad \text{[Equation 1]}$$

and $$R_3 = \frac{R_1}{2}, \quad \text{[Equation 2]}$$

where $R_1$ represents the value of the resistance for the termination resistance $R_1$ of FIG. 2A, $R_2$ represents the value of the resistance for the termination resistance $R_2$, and $R_3$ represents the value of the resistance for the termination resistance $R_3$. As such, the value of the voltage source $v_s$ may be determined using the following equation:

$$v_s = 2 * v_0, \quad \text{[Equation 3]}$$

where $v_s$ represents the value of the source voltage $v_s$ and $v_0$ represents the value of the differential output voltage $v_0$. Because the value of the source voltage $v_s$ for the voltage-mode line driver 109b is twice the value of the differential output voltage $v_0$ of the current-mode line driver 109a (FIG. 2A), the voltage-mode line driver 109b may be less efficient in terms of power consumption than the current-mode line driver 109a.

Figure 3B:
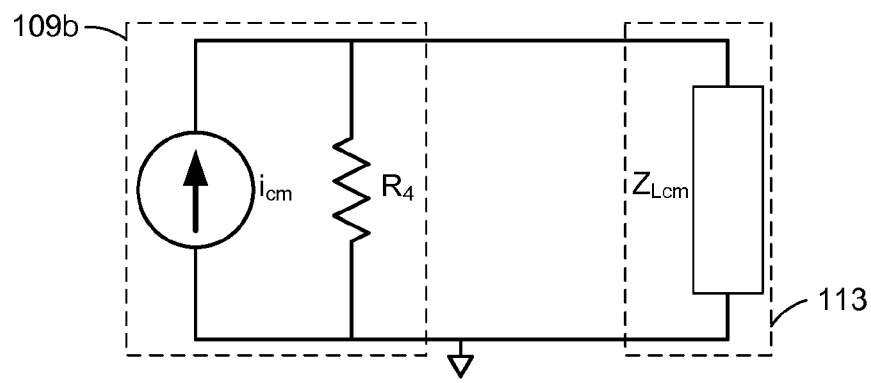
FIG. 3B is a schematic diagram representing an example of a common-mode equivalent circuit for the voltage-mode line driver of FIG. 3A according to various embodiments of the present disclosure.

Turning now to FIG. 3B, shown is a schematic diagram representing an example of a common-mode equivalent circuit for the voltage-mode line driver 109b of FIG. 3A according to various embodiments of the present disclosure. The common-mode equivalent circuit includes a common-mode current $i_{cm}$ and a common-mode source resistance $R_4$. The common-mode current $i_{cm}$ represents the undesirable common-mode current component that may be associated with the voltage-mode line driver 109b. Associated with the load 113 is a common-mode load impedance $Z_{Lcm}$. For cases in which the common-mode load impedance $Z_{Lcm}$ is much greater than the common-mode source resistance $R_4$, substantially all of the common-mode current $i_{cm}$, flows through the source resistance $R_4$ and avoids flowing through the common-mode load impedance $Z_{Lcm}$. As such, the voltage-mode line driver 109b may have better common-mode performance than the current-mode line driver 109a (FIG. 2A).

Figure 4:
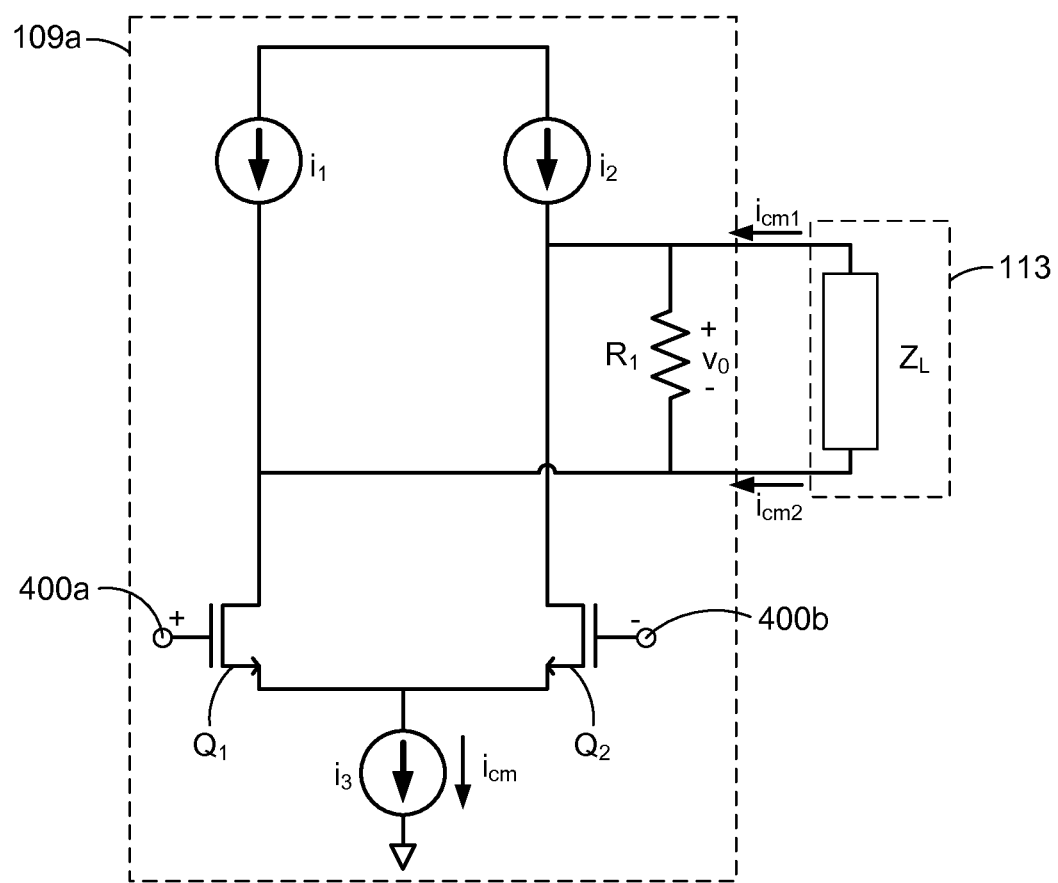
FIG. 4 is a schematic diagram representing a first example of a current-mode line driver that may be employed in the communication environment of FIG. 1 according to various embodiments of the present disclosure.

Turning now to FIG. 4, shown is a schematic diagram representing an example of a current-mode line driver 109a that may be employed in the communication environment 100 (FIG. 1) according to various embodiments of the present disclosure. The embodiment shown in FIG. 4 includes the current-mode line driver 109a in communication with the load 113. Associated with the load 113 is a load impedance $Z_L$. The current-mode line driver 109a includes a first differential input line 400a, a second differential input line 400b, a first source current $i_1$, a second source current $i_2$, a third source current $i_3$, a transistor $Q_1$, a transistor $Q_2$, a termination resistance $R_1$, and potentially other components.

The first differential input line 400a is coupled to the gate of the transistor $Q_1$, and the second differential input line 400b is coupled to the gate of the transistor $Q_2$. The output of the first current source $i_1$ is coupled to the drain of the transistor $Q_1$ and one of the lines of the termination resistance $R_1$. Similarly, the output of the second current source $i_2$ is coupled to the drain of the transistor $Q_2$ and one of the lines of the termination resistance $R_1$.

The sources of the first transistor $Q_1$ and the second transistor $Q_2$ are coupled to the third current source $i_3$, as shown. The value of the current flowing through the third current source $i_3$ may be represented using the following equation:

$$i_3 = i_1 + i_2, \quad \text{[Equation 4]}$$

where $i_1$ represents the value of the current through the first current source $i_1$, $i_2$ represents the value of the current through the second current source $i_2$, and $i_3$ represents the value of the current through the third current source $i_3$.

As discussed above, a common-mode current $i_{cm}$ may be associated with the line driver 109 and may be experienced by the load 113. In the present example, a first common-mode current component $i_{cm1}$ and a second common-mode current component $i_{cm2}$ may be received by the load impedance $Z_L$. The values of the common-mode current components may be related using the following equation:

$$i_{cm} = i_{cm1} + i_{cm2}, \quad \text{[Equation 5]}$$

where $i_{cm}$ represents the value of the common-mode current $i_{cm}$ associated with the current-mode line driver 109a, and $i_{cm1}$ and $i_{cm2}$ represent the values of the first common-mode current component $i_{cm1}$ and $i_{cm2}$ the second common-mode current component $i_{cm2}$, respectively.

In order to reduce the amount of the first common-mode current component $i_{cm1}$ and the second common-mode current component $i_{cm2}$, the line resistance $R_1$ may include a center-tap to which a relatively large capacitance may be coupled. For example, one line of a relatively large capacitor may be coupled to the center-tap of the termination resistance $R_1$, and the other line of the capacitor may be coupled to ground. As an alternative, the input of a voltage buffer may be coupled to a reference common-mode voltage, and the output of the voltage buffer may be coupled to the center-tap of the termination resistance $R_1$. As a result, the amount of the first common-mode current component $i_{cm1}$ and the second common-mode current component $i_{cm2}$ may be reduced.

Figure 5:
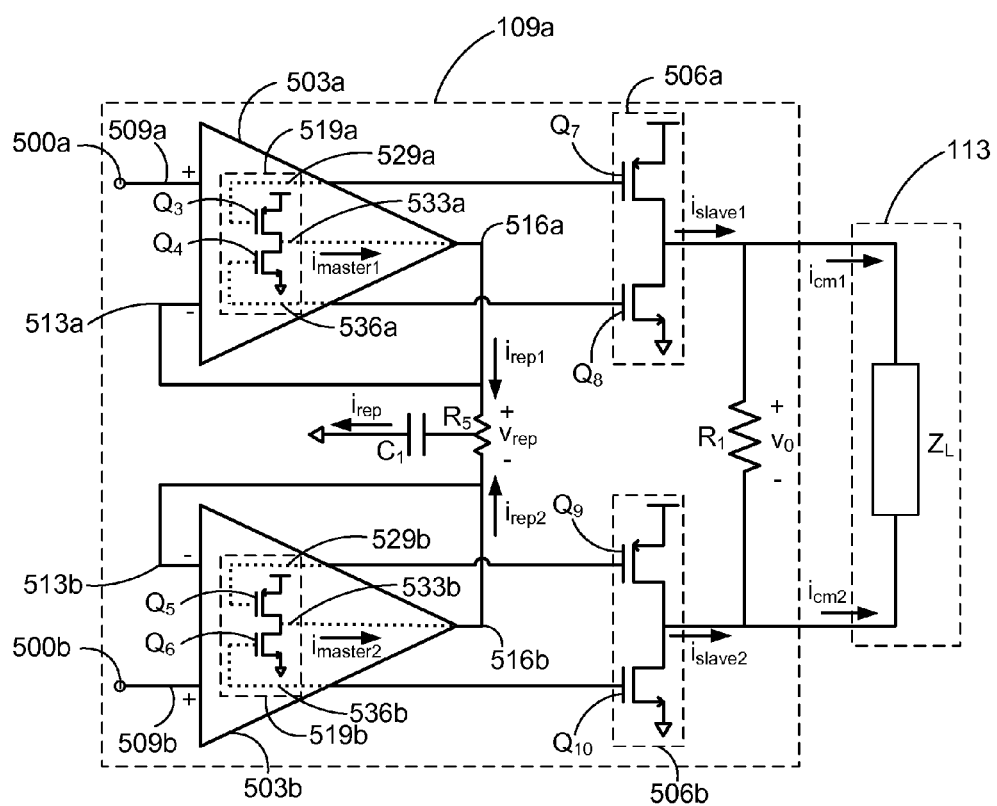
FIG. 5 is a schematic diagram representing a second example of a current-mode line driver that may be employed in the communication environment of FIG. 1 according to various embodiments of the present disclosure.

With reference to FIG. 5, shown is a schematic diagram representing an example of another current-mode line driver 109a that may be employed in the communication environment of FIG. 1 according to various embodiments of the present disclosure. Associated with the load 113 is a load impedance $Z_L$. The current-mode line driver 109a in the present example includes a first differential input line 500a, a second differential input line 500b, a first voltage buffer 503a, a second voltage buffer 503b, a first current mirror slave 506a, a second current mirror slave 506b, a termination resistance $R_1$, a replica load resistance $R_5$, a capacitance $C_1$, and potentially other components that are not discussed in detail herein for brevity.

The first voltage buffer 503a includes a non-inverting input line 509a, an inverting input line 513a, a first buffer output line 516a, an amplifier stage 519a, and other components that are not discussed in detail herein for brevity. The non-inverting input line 509a of the first voltage buffer 503a is coupled to the first differential input line 500a and is configured to receive a differential input signal. The inverting input line 513a of the first voltage buffer 503a is coupled to the first buffer output line 516a of the first voltage buffer 503a. Thus, the first voltage buffer 503a outputs on the first buffer output line 516a a voltage signal that is substantially equal to the voltage for the differential input signal that may be applied to the first differential input line 500a.

The amplifier stage 519a is a portion of the first voltage buffer 503a that may amplify signals in the first voltage buffer 503a. To this end, the amplifier stage 519a may be embodied in the form of a class AB amplifier stage or any other type of amplifier stage. In the present example, the amplifier stage 519a includes a transistor $Q_3$, a transistor $Q_4$, a first line 529a, a second line 533a, a third line 536a, and potentially other components. The gate of the transistor $Q_3$ is coupled to the first line 529a of the amplifier stage 519a, and the gate of the transistor $Q_4$ is coupled to the third line 536a of the amplifier stage 519a. The drain of the transistor $Q_3$ is coupled to the drain of the transistor $Q_4$. Furthermore, the drain of the transistor $Q_3$ and the drain of the transistor $Q_4$ are coupled to the second line 533a of the amplifier stage 519a. The second line 533a of the amplifier stage 519a is further coupled to the first buffer output line 516a of the first voltage buffer 503a.

The second voltage buffer 503b includes a non-inverting input line 509b, an inverting input line 513b, a second buffer output line 516b, an amplifier stage 519b, and other components that are not discussed in detail herein for brevity. The non-inverting input line 509b is coupled to the second differential input line 500b and is configured to receive a differential input signal. The inverting input line 513b of the second voltage buffer 503b is coupled to the second buffer output line 516b. Thus, the second voltage buffer 503b outputs to the second buffer output line 516b a voltage signal that is substantially the same voltage as the differential input signal that is applied to the second differential input line 500b.

The amplifier stage 519b is a portion of the second voltage buffer 503b that may amplify signals in the second voltage buffer 503b. To this end, the amplifier stage 519b may be embodied in the form of a class AB amplifier stage or any other type of amplifier stage. In the present example, the amplifier stage 519b includes a transistor $Q_5$, a transistor $Q_6$, a first line 529b, a second line 533b, a third line 536b, and potentially other components. The gate of the transistor $Q_5$ is coupled to the first line 529b of the amplifier stage 519b, and the gate of the transistor $Q_6$ is coupled to the third line 536b of the amplifier stage 519b. The drain of the transistor $Q_5$ is coupled to the drain of the transistor $Q_6$. Furthermore, the drain of the transistor $Q_5$ and the drain of the transistor $Q_6$ are coupled to the second line 533b of the amplifier stage 519b. The second line 533b of the amplifier stage 519b is further coupled to the second buffer output line 516b.

The first current mirror slave 506a may generate a current $i_{slave1}$ that is proportional to the current $i_{master1}$ flowing from the second line 533a of the amplifier stage 519a in the first voltage buffer 503a. As such, the amplifier stage 519a in the first voltage buffer 503a may be regarded as being a current mirror master for the first current mirror slave 506a. Various embodiments of the first current mirror slave 506a may employ a transistor $Q_7$, a transistor $Q_8$, and potentially other components. The gate of the transistor $Q_7$ in the first current mirror slave 506a is coupled to the first line 529a of the amplifier stage 519a in the first voltage buffer 503a. Additionally, the gate of the transistor $Q_8$ in the first current mirror slave 506a is coupled to the third line 536a of the amplifier stage 519a in the first voltage buffer 503a. Thus, the current $i_{slave1}$ that is output from the first current mirror slave 506a may be represented by the following equation:

$$i_{slave1} = m * i_{master1}, \quad \text{[Equation 6]}$$

where $i_{slave1}$ is the value of the current $i_{slave1}$ output from the first current mirror slave 506a, $i_{master1}$ is the value of the current $i_{master1}$ output from the amplifier stage 519a, and m is a scaling factor resulting from parameters set by the first current mirror slave 506a.

The second current mirror slave 506b may generate a current $i_{slave2}$ that is proportional to the current $i_{master2}$ flowing from the second line 533b of the amplifier stage 519b in the second voltage buffer 503b. As such, the amplifier stage 519b in the second voltage buffer 503b may be considered a current mirror master for the second current mirror slave 506b. Various embodiments of the second current mirror slave 506b may employ a transistor $Q_9$, a transistor $Q_{10}$, and potentially other components. The gate of the transistor $Q_9$ in the second current mirror slave 506b is coupled to the first line 529b of the amplifier stage 519b in the second voltage buffer 503b. Additionally, the gate of the transistor $Q_{10}$ in the second current mirror slave 506b is coupled to the third line 536b of the amplifier stage 519a in the second voltage buffer 503a. Thus, the current $i_{slave2}$ output from the second current mirror slave 506b may be represented by the following equation:

$$i_{slave2} = m * i_{master2}, \quad \text{[Equation 7]}$$

where $i_{slave2}$ is the value of the current $i_{slave2}$ output from the second current mirror slave 506b, $i_{master2}$ is the value of the current $i_{master2}$ output from the amplifier stage 519b in the second voltage buffer 503b, and m is a scaling factor resulting from parameters set by the second current mirror slave 506b. It is noted that m in equation 7 may be the same value as m in equation 6.

The replica load resistance $R_5$ may facilitate replicating signals that are associated with the load impedance $Z_L$. In various embodiments, the value of the replica load resistance $R_5$ may be given by the following equation:

$$R_5 = m * R_{load}, \quad \text{[Equation 8]}$$

where $R_5$ is the value of the replica load resistance $R_5$, $R_{load}$ is the value of the real component of the load impedance $Z_L$, and m is the scaling factor resulting from parameters set by the first current mirror slave 506a and the second current mirror slave 506b. As such, the differential output voltage $v_O$ across the load impedance $Z_L$ may be related to the replica load voltage $v_{rep}$ by the following equation:

$$v_O = v_{rep}, \quad \text{[Equation 9]}$$

where $v_O$ is the value of the differential output voltage $v_O$, and $v_{rep}$ is the value of the voltage $v_{rep}$ across the replica load resistance $R_5$. Thus, the replica load resistance may facilitate replicating signals that are associated with the load impedance $Z_L$.

According to various embodiments, the replica load resistance $R_5$ may be embodied in the form of a tapped resistor, such as a center-tapped resistor. A relatively large capacitor $C_1$ may be coupled to the center-tap of the replica load resistance $R_5$ and to ground in order to provide an AC ground at the center-tap of the resistor. As an alternative, a voltage buffer may be coupled to the replica load resistance $R_5$, such that the input of the voltage buffer is coupled to a reference common-mode voltage, and the output of the voltage buffer is coupled to the center-tap of the replica load resistance $R_5$. As a result of these configurations, replica common-mode current components $i_{rep1}$ and $i_{rep2}$ flow into the replica load resistance $R_5$, and a replica common-mode current $i_{rep}$ flows from the center-tap of the replica load resistance $R_5$ to the ground. The replica common-mode current components $i_{rep1}$ and $i_{rep2}$ may be related to the replica common-mode current $i_{rep}$ using the following equation:

$$i_{rep1} = i_{rep2} \quad \text{[Equation 10]}$$
$$= \frac{i_{rep}}{2},$$

where $i_{rep1}$ and $i_{rep2}$ represent the values of the replica common-mode current components $i_{rep1}$ and $i_{rep2}$, and $i_{rep}$ represents the value of the replica common-mode current $i_{rep}$. The replica common-mode current $i_{rep}$ may be related to the common-mode output currents $i_{cm1}$ and $i_{cm2}$ by the following equation:

$$i_{cm1} + i_{cm2} = m \ast i_{rep}, \quad \text{[Equation 11]}$$

where $i_{cm1}$ represents the value of the common-mode output current $i_{cm1}$, $i_{cm2}$ represents the value of the common-mode output current $i_{cm2}$, $i_{rep}$ represents the value of the replica common-mode current $i_{rep}$, and m is the scaling factor resulting from the first current mirror slave 506a and the second current mirror slave 506b.

Next, a general description of an example of the operation of the current-mode line driver 109a in FIG. 5 is provided. In operation, a first differential input signal may be applied to the first differential input line 500a, and a second differential input signal may be applied to the second differential input line 500b. The first differential input signal is received by the first voltage buffer 503a, which buffers the first differential input signal and outputs the corresponding voltage to the first buffer output line 516a. Similarly, the second differential input signal is received by the second voltage buffer 503b, which buffers the first differential input signal and outputs the corresponding voltage to the second buffer output line 516b. These signals that are output from the first voltage buffer 503a and the second voltage buffer 503b are applied to the replica load resistance $R_5$, thereby generating the replica load voltage $v_{rep}$. Additionally, the replica common-mode current $i_{rep}$ flows from the tap in the replica load resistance $R_5$ to ground through the capacitance $C_1$.

The signal that is output from the first voltage buffer 503a on the first buffer output line 516a is mirrored to the output of the current-mode line driver 109a using the first current mirror slave 506a. In this respect, the amplifier stage 519a in the first voltage buffer 503a acts as a current mirror master for the first current mirror slave 506a. As a result, the current $i_{slave1}$ may be mirrored to the output of the current-mode line driver 109a in an amount that is proportional to the current $i_{master1}$, as expressed in equation 6 above.

Similarly, the signal that is output from the second voltage buffer 503b on the second buffer output line 516b may be mirrored to the output of the current-mode line driver 109a using the second current mirror slave 506b. In this respect, the amplifier stage 519b in the second voltage buffer 503b acts as a current mirror master for the second current mirror slave 506b. As a result, the current $i_{slave2}$ may be mirrored to the output of the current-mode line driver 109a in an amount that is proportional to the current $i_{master2}$, as expressed in equation 7 above.

Because an undesirable common-mode signal may be present in the current $i_{master1}$ and/or in the current $i_{master2}$, the first current mirror slave 506a and the second current mirror slave 506b may multiply the undesirable current-mode signal when mirroring the currents $i_{master1}$ and $i_{master2}$. Thus, the resulting common-mode output currents $i_{cm1}$ and $i_{cm2}$ may be provided to the load 113. As previously discussed, the common-mode currents $i_{cm1}$ and $i_{cm2}$ may be provided to the output of the current-mode line driver 109a in an amount that is proportional to the current $i_{rep}$, as expressed in equation 10 above. As a result, the quality of the signal received by the receiver device 106 (FIG. 2) may be degraded, EMI may occur, or the receiver device 106 may not function as desired.

Figure 6:
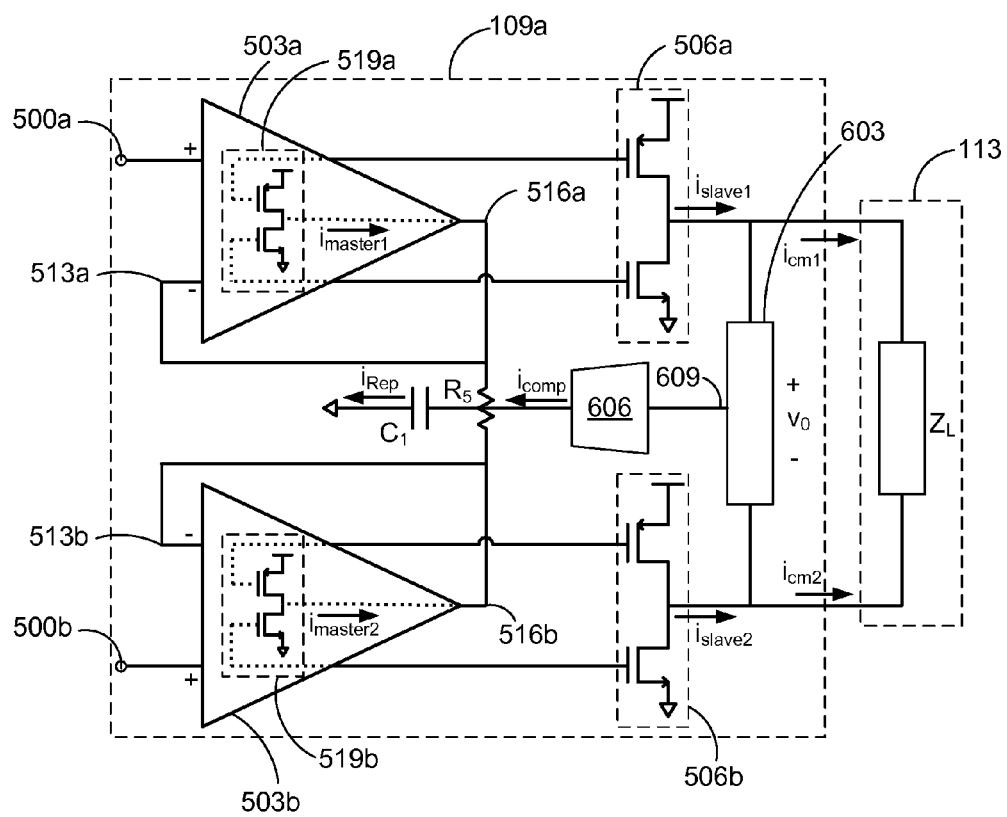
FIG. 6 is a schematic diagram representing a third example of a current-mode line driver that may be employed in the communication environment of FIG. 1 according to various embodiments of the present disclosure.

Turning now to FIG. 6, shown is a schematic diagram representing another example of a current-mode line driver 109a that may be employed in the communication environment of FIG. 1 according to various embodiments of the present disclosure. The current-mode line driver 109a shown in FIG. 6 is similar to the current-mode line driver 109a shown in FIG. 5. However, in the embodiment shown in FIG. 6, the current-mode line driver 109a further includes a common-mode current sense element 603, a transconductance element 606, and potentially other components that are not discussed in detail herein for brevity.

The common-mode current sense element 603 may be a component configured to provide a signal 609 that corresponds to the value of the sum of the common-mode output currents $i_{cm1}$ and $i_{cm2}$. For example, the common-mode current sense element 603 may provide a voltage that is proportional to the sum of the common-mode output currents $i_{cm1}$ and $i_{cm2}$. To this end, the common-mode current sense element 603 may be embodied in the form of a first resistor and a second resistor that are connected in series with respect to each other such that the first resistor and the second resistor are coupled to the outputs of the current-mode line driver 109a. The first resistor and the second resistor may have relatively large resistance values such that a relatively small current flows through the common-mode current sense element 603. At the point where the first resistor and the second resistor are coupled to each other, a common-mode voltage signal 609 may be provided that is proportional to the total common-mode current that is experienced by the load 113.

The input of the transconductance element 606 in the present example is coupled to the output of the common-mode current sense element 603, and the output of the transconductance element 606 is coupled to the tap in the replica load resistance $R_5$. The transconductance element 606 may be an element that is configured to receive the signal 609 and provide a compensating current $i_{comp}$ based at least in part on the signal 609. For example, the compensating current $i_{comp}$ may be proportional to the voltage of the signal 609. To this end, the transconductance element 606 according to various embodiments may be a transconductance amplifier. The output of the transconductance element 606 is coupled to the tap in the resistance R5. As such, the first buffer output line 516a and the second buffer output line 516b are in communication with the output of the transconductance element 606.

It is noted that the value of the transconductance for the transconductance element 606 may be limited by the stability requirement that the gain-bandwidth product of the common-mode loop must be lower than the second pole that occurs at the center tap of the replica load resistance $R_5$. Nonetheless, the magnitude of the compensating current $i_{comp}$ may be configured to be substantially the same as the magnitude of the replica common-mode current $i_{rep}$, with the polarity of the compensating current $i_{comp}$ being opposite of the polarity of the replica common-mode current $i_{rep}$. This relation may be expressed as follows:

$$i_{comp} = -i_{rep}, \quad \text{[Equation 12]}$$

where $i_{comp}$ represents the value of the compensating current $i_{comp}$, and $i_{rep}$ represents the value of the replica common-mode current $i_{rep}$. As such, when the compensating current $i_{comp}$ is provided to the center-tap in the replica load resistance $R_5$, the compensating current $i_{comp}$ may substantially negate or eliminate the replica common-mode current $i_{rep}$.

Next, a general description of an example of the operation of the current-mode line driver 109a in FIG. 6 is provided. The operation of the current-mode line driver 109a in FIG. 6 is similar to the operation of the current-mode line driver 109a in FIG. 5. However, in the current-mode line driver in FIG. 6, the common-mode current sense element 603 provides the signal 609 that corresponds to the value of the total common-mode current experienced by the load 113. For example, if the common-mode current sense element 603 is embodied in the form of a first resistor in series with a second resistor and coupled across the output of the current-mode line driver 109a, the point where the first resistor and the second resistor are coupled to each other may provide a common-mode voltage signal 609 that is proportional to the sum of the common-mode output currents $i_{cm1}$ and $i_{cm2}$ that is experienced by the load 113.

The signal 609 is provided to the input of the transconductance element 606, which provides the compensating current $i_{comp}$ based at least in part on the signal 609. In turn, the compensating current $i_{comp}$ is provided to the tap in the replica load resistance $R_5$. Because the value of the compensating current $i_{comp}$ may be equal and opposite to the value of the replica common-mode current $i_{rep}$, the compensating current $i_{cm}$ may substantially negate or eliminate the replica common-mode current $i_{rep}$. As a result, the common-mode components in the current $i_{master1}$ the current $i_{master2}$ may be negated.

As represented in equations 6 and 7 above, the value of the current $i_{slave1}$ may be proportional to the value of the current $i_{master1}$, and the value of the current $i_{slave2}$ may be proportional to the value of the current $i_{master2}$. Thus, by the compensating current $i_{comp}$ substantially negating the common-mode components in the current $i_{master1}$ and the current $i_{master2}$, the common-mode components that may otherwise be present in the current $i_{master2}$ and the current $i_{master2}$ may be negated. Using equations 10 and 11 above, the value of the total common-mode current may be expressed using the following equation:

$$i_{cm1} + i_{cm2} = m^*(i_{rep} + i_{comp})m^*(i_{rep} - i_{rep}) = 0. \quad \text{[Equation 13]}$$

Thus, the total common-mode current experienced by the load 113 may be substantially negated.

Figure 7:
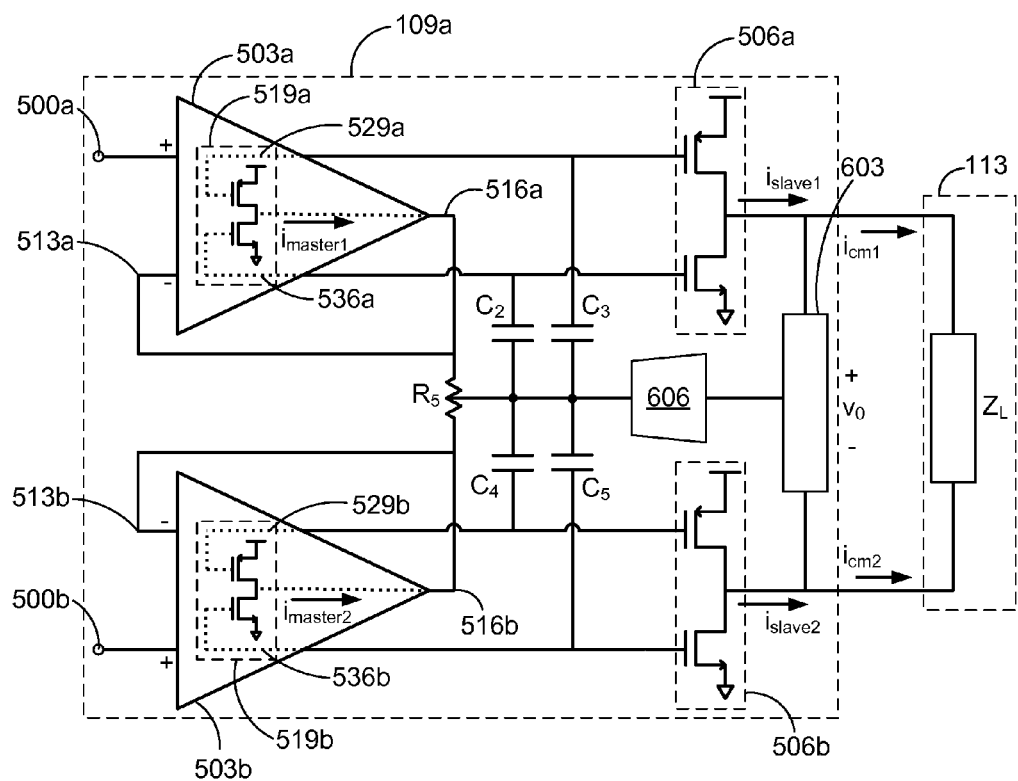
FIG. 7 is a schematic diagram representing a fourth example of a current-mode line driver that may be employed in the communication environment of FIG. 1 according to various embodiments of the present disclosure.

Turning now to FIG. 7, shown is a schematic diagram representing another example of a current-mode line driver 109a that may be employed in the communication environment of FIG. 1 according to various embodiments of the present disclosure. The current-mode line driver 109a shown in FIG. 7 is similar to the current-mode line driver 109a shown in FIG. 6. However, in the embodiment shown in FIG. 7, the capacitance $C_1$ shown in FIG. 6 is not present. In addition, the current-mode line driver 109a includes the capacitances $C_2$-$C_5$. The capacitances $C_2$-$C_5$ may utilize the Miller effect to compensate the common-mode loop for stability. As a result, the capacitances $C_2$-$C_5$ may facilitate a wider bandwidth for the common-mode loop. To this end, the capacitances $C_2$ and $C_5$ may be embodied in the form of common-mode Miller compensation capacitors.

The capacitance $C_2$ is coupled to the output of the transconductance element 606 and to the third line 536a of the amplifier stage 519a in the first voltage buffer 503a, and the capacitance $C_3$ is coupled to the output of the transconductance element 606 and to the first line 529a of the amplifier stage 519a in the first voltage buffer 503a. Similarly, the capacitance $C_4$ is coupled to the output of the transconductance element 606 and to the first line 529b of the amplifier stage 519b of the second voltage buffer 503b, and the capacitance $C_5$ is coupled to the output of the transconductance element 606 and to the third line 536b of the amplifier stage 519b in the second voltage buffer 503b. The values of capacitances $C_2$-$C_5$ may be relatively small as compared to the value of the capacitance $C_1$ (FIG. 6). Additionally, each capacitance $C_2$-$C_5$ may be in series connection with a resistance (not shown) to facilitate Miller effects that may increase the bandwidth for the common-mode loop.

Figure 8:
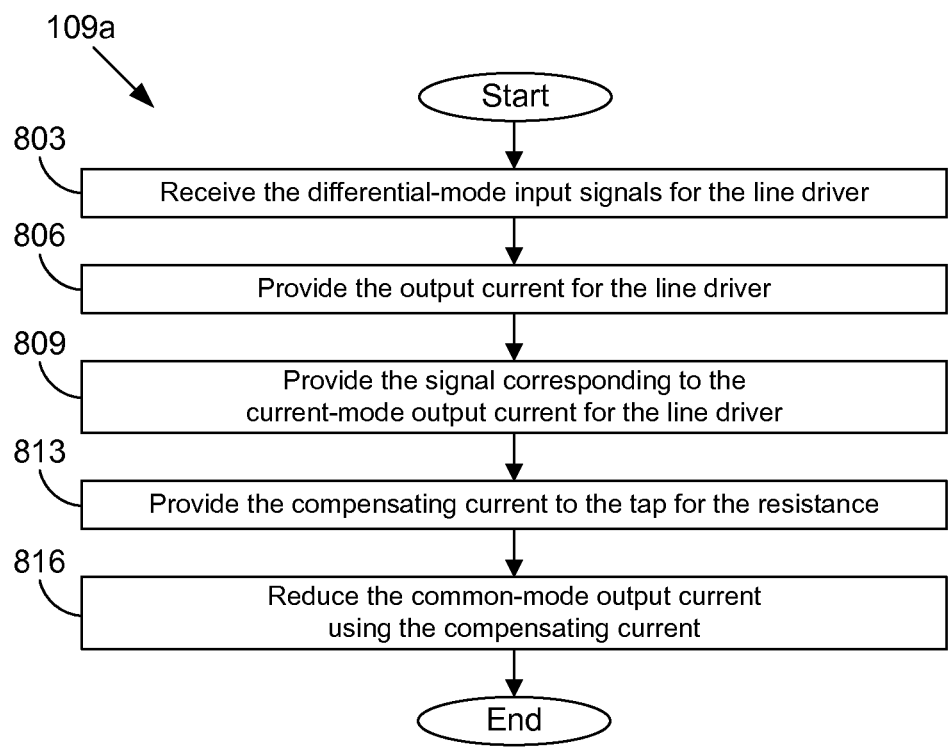
FIG. 8 is a flowchart illustrating an example of functionality implemented by a common-mode line driver that may be employed in the communication environment of FIG. 1 according to various embodiments of the present disclosure.

Referring next to FIG. 8, shown is a flowchart illustrating an example of functionality implemented by the current-mode line driver 109a of FIGS. 6 and/or 7 according to various embodiments of the present disclosure. It is understood that the flowchart of FIG. 8 provides merely an example of the many different types of functionality that may be implemented by the circuitry in the current-mode line driver 109a as described herein. Additionally, the flowchart of FIG. 8 may be viewed as depicting an example of steps of a method implemented in the current-mode line driver 109a according to one or more embodiments.

To begin, at reference number 803, the current mode-line driver 109a receives the differential-mode input signals. The differential-mode input signals may be voltage signals that are applied to the first differential input line 500a (FIG. 5) and the second differential input line 500b (FIG. 5). Next, as shown at reference number 806, the line driver 109a provides the output current for that may be received by the load 113 (FIG. 1). The output current may be, for example, the current $i_{slave1}$ (FIG. 5) and the current $i_{slave2}$ (FIG. 5) and may have a common-mode component and a differential-mode component. At reference number 809, the line driver 109a provides the signal 609 (FIG. 6) corresponding to the amount of the current-mode component of the output current. As discussed above, the signal 609 may be a voltage that corresponds to the amount of the common-mode component of the output current.

Moving to reference number 813, the current-mode line drive 109a provides the compensating current $i_{comp}$ to the tap in the resistance $R_5$ (FIG. 6). To this end, the transconductance element 606 may receive the signal 609 and generate the compensating current $i_{comp}$ based at least in part on the signal 609. As a result of the compensating current $i_{comp}$ being provided to the tap in the resistance $R_5$, the common-mode output current for the current-mode line driver 109a may be reduced, as shown at reference number 816. Thereafter, the process ends.

Although the flowchart of FIG. 8 shows a specific order of execution, it is understood that the order of execution may differ from that which is depicted. For example, the order of execution of two or more blocks may be scrambled relative to the order shown. Also, two or more blocks shown in succession in FIG. 8 may be executed concurrently or with partial concurrence. Further, in some embodiments, one or more of the items shown in FIG. 8 may be skipped or omitted. In addition, any number of elements might be added to the logical flow described herein, for purposes of enhanced utility, accounting, performance measurement, or providing troubleshooting aids, etc. It is understood that all such variations are within the scope of the present disclosure.

The components described herein may be implemented by circuitry. In this regard, such circuitry may be arranged to perform the various functionality described above by generating and/or responding to electrical or other types of signals. The circuitry may be general purpose hardware or hardware that is dedicated to performing particular functions. The circuitry may include, but is not limited to, discrete components, integrated circuits, or any combination of discrete components and integrated circuits. Such integrated circuits may include, but are not limited to, one or more microprocessors, system-on-chips, application specific integrated circuits, digital signal processors, microcomputers, central processing units, programmable logic devices, state machines, other types of devices, and/or any combination thereof. As used herein, the circuitry may also include interconnects, such as lines, wires, traces, metallization layers, or any other element through which components may be coupled. Additionally, the circuitry may be configured to execute software to implement the functionality described herein.

It is emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, at least the following is claimed:

1. A line driver comprising:
a common-mode current sense element connected to an output for the line driver, the common-mode current sense element configured to provide a signal corresponding to a common-mode output current for the line driver;
a transconductance element configured to receive the signal from the common-mode current sense element and to provide a compensating current based at least in part on the signal; and
a capacitance coupled to a transconductance element output and a ground for the line driver.

2. The line driver of claim 1, wherein the common-mode current sense element comprises a first resistor coupled in series to a second resistor.

3. The line driver of claim 1, wherein the transconductance element comprises a transconductance amplifier.

4. The line driver of claim 1, further comprising:
a voltage buffer comprising a voltage buffer input and a voltage buffer output, the voltage buffer output being connected to a transconductance element output.

5. A line driver comprising:
a common-mode current sense element connected to an output for the line driver, the common-mode current sense element configured to provide a signal corresponding to a common-mode output current for the line driver;
a transconductance element configured to receive the signal from the common-mode current sense element and to provide a compensating current based at least in part on the signal;
a resistance coupled to a transconductance element output, the resistance comprising a resistance tap;

a first voltage buffer configured to receive a first input signal for the line driver, the first voltage buffer comprising a first voltage buffer output that is connected to the resistance tap; and
a second voltage buffer configured to receive a second input signal for the line driver, the second voltage buffer comprising a second voltage buffer output connected to the resistance tap.

6. The line driver of claim 5, further comprising:
a first current mirror slave comprising a first current mirror slave input and a first current mirror slave output, the first current mirror slave input being connected to the first voltage buffer, the first current mirror slave output being connected to the common-mode current sense element; and
a second current mirror slave comprising a second current mirror slave input and a second current mirror slave output, the second current mirror slave input being connected to the second voltage buffer, the second current mirror slave output being connected to the common-mode current sense element.

7. A line driver comprising:
a common-mode current sense element connected to an output for the line driver, the common-mode current sense element configured to provide a signal corresponding to a common-mode output current for the line driver;
a transconductance element configured to receive the signal from the common-mode current sense element and to provide a compensating current based at least in part on the signal; and
a plurality of capacitances connected to an output of the transconductance element and with a plurality of inputs for a plurality of current mirror slaves.

8. A method, comprising:
obtaining a differential-mode input voltage for a line driver;
providing a differential-mode output current for the line driver based at least in part on the differential-mode input voltage;
providing a compensating current corresponding to a common-mode output current to a tap associated with resistance; and
reducing the common-mode output current based on the compensating current.

9. The method of claim 8, further comprising providing a voltage corresponding to the common-mode output current to a transconductance element; and
wherein providing the compensating current further comprises providing the compensating current using the transconductance element and based at least in part on the voltage.

10. The method of claim 9, further comprising utilizing a common-mode Miller effect using a plurality of capacitances coupled to the transconductance element that provides the compensating current.

11. The method of claim 8, further comprising:
providing an output signal of a voltage buffer to a resistance; and
reducing a common-mode component of the output signal of the voltage buffer based on the compensating current.

12. The method of claim 8, further comprising providing a signal corresponding to the common-mode output current using a common-mode current sense element.

13. An apparatus comprising circuitry configured to:
provide a signal corresponding to a common-mode output current for a line driver;

provide a compensating current to a tap associated with resistance based at least in part on the signal; and reduce the common-mode output current based on the compensating current.

14. The apparatus of claim 13, wherein the circuitry is further configured to:

provide an output signal of a voltage buffer to the resistance; and reduce a common-mode component of the output signal of the voltage buffer based on the compensating current.

15. The apparatus of claim 13, wherein the circuitry is further configured to:

buffer a first differential input signal for the line driver; and buffer a second differential input signal for the line driver.

16. The apparatus of claim 13, wherein the circuitry is further configured to provide a voltage corresponding to the common-mode output current to a transconductance element; and wherein providing the compensating current further comprises providing the compensating current using the transconductance element and based at least in part on the voltage.

17. The apparatus of claim 16, wherein the circuitry is further configured to utilize a common-mode Miller effect using a plurality of capacitances coupled to the transconductance element that provides the compensating current.

18. The apparatus of claim 13, wherein the circuitry is further configured to provide a signal corresponding to the common-mode output current using a common-mode current sense element.

* * * * *